(12) United States Patent
Chen (10) Patent No.: US 8,593,215 B2
(45) Date of Patent: Nov. 26, 2013

(54) POWER GATING FOR IN-RUSH CURRENT MITIGATION

(75) Inventor: Shih-Hao Chen, Hsinchu (TW)

(73) Assignees: Global Unichip Corporation, Hsinchu; Taiwan Semiconductor Manufacturing Company Limited, Hsinchu ( * ) Notice: Subject to any disclaimer, the term of this patent is extended or adjusted under 35 U.S.C. 154(b) by 0 days.

(21) Appl. No.: 13/354,384

(22) Filed: Jan. 20, 2012

(65) Prior Publication Data
US 2012/0188000 A1 Jul. 26, 2012

(30) Foreign Application Priority Data
Jan. 26, 2011 (TW) .............................. 100102786 A (51) Int. Cl.
*G05F 1/10* (2006.01)

(52) U.S. Cl.
USPC ........................................... 327/544; 323/908

(58) Field of Classification Search
USPC ........................................... 327/544; 323/908
See application file for complete search history.

(56) References Cited

U.S. PATENT DOCUMENTS 6,285,539 B1 * 9/2001 Kashimoto et al. ............ 361/101
6,784,726 B2 * 8/2004 Burr .............................. 327/546

* cited by examiner

*Primary Examiner* — Kenneth B. Wells
(74) *Attorney, Agent, or Firm* — Bacon & Thomas, PLLC (57) ABSTRACT

The invention discloses a power gating for in-rush current mitigation. Firstly the circuit uses small power switch cells at first stage, such that those power switch cells run in saturation region. Secondly a delay unit delays a switch signal to control the dwell time of current to reduce the peak value of the current. Thirdly large power switch cells are used at the rest, such that those power switch cells operate in linear region.

10 Claims, 8 Drawing Sheets

POWER GATING FOR IN-RUSH CURRENT MITIGATION

BACKGROUND OF THE INVENTION

1. Field of the Invention

This invention relates to a circuit for stabilizing current, and more particularly to a power gating apparatus for in-rush current mitigation.

2. Description of the Prior Art

Currently, the system-on-a-chip (SOC) applied in telecommunication products or in computers is developing in the trend of high performance and portability, and thus its power consumption has become an important consideration in design. The most effective way to reduce the power consumption of a circuit is to reduce the operating voltage of the circuit. However, if the operating voltage is lowered, the overall performance of the circuit will be lowered accordingly. Therefore, in order to maintain the overall performance of the circuit, threshold voltages of transistors must be lowered, which will lead to an indexed growth of the sub-threshold leakage current.

Due to the nanoscale nature of semiconductor development processing, power consumption sharply increases due to leakage current. In order to reduce the leakage current, a technique referred to as power gating is used to cut off power supplied to a circuit block that is not currently used in a chip.

It is known to provide integrated circuits with one or more virtual power rails and one or more virtual ground rails. These virtual rails are selectively connected or disconnected to the main power rails and the main ground rails respectively by header transistors and footer transistors. This technique is useful in reducing power consumption when a block/domain within an integrated circuit is not required to be active and accordingly can be powered down and isolated from the power supply and the ground by the use of these header and/or footer transistors. These header and/or footer devices are selected such that when they are switched off they have a high resistance and thus, a low leakage current. This is generally done by selecting devices with a high threshold voltage.

Accordingly, those skilled in the art seek methods and apparatus that are capable of controlling integrated circuits incorporating power gating technology in such a manner that reacts to the dynamic conditions being experienced by the power gating circuitry.

Figure 1:
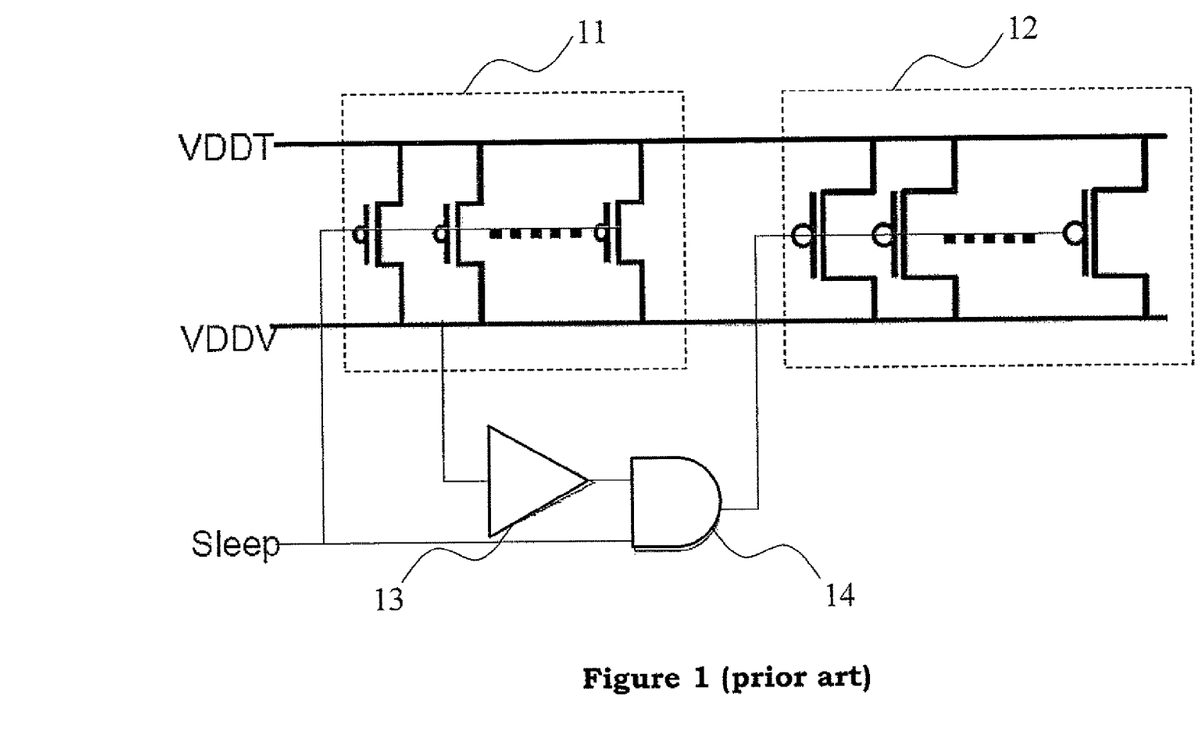
FIG. 1 is a diagram showing a circuit for in-rush current mitigation according to the prior art.

FIG. 1 shows a circuit for in-rush current mitigation according to the prior art. Small switch cells 11 receive power and "Sleep" signal, and after a Schmitt trigger 13 detects voltage signal, a logic unit 14 enable/disable big switch cells 12. The extra Schmitt trigger compromises the IC design in some applications.

Figure 2:
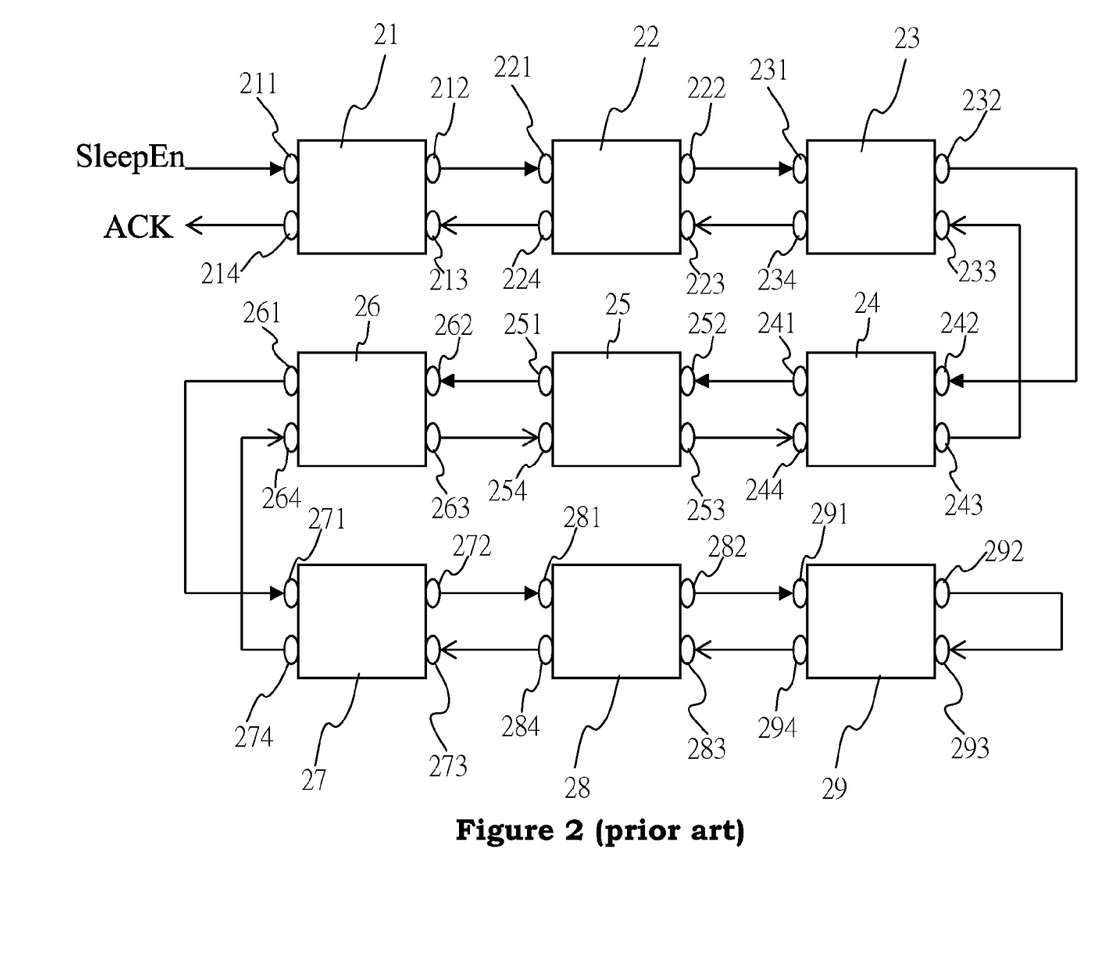
FIG. 2 is a diagram showing a circuit with Mother/Daughter switch cell according to the prior art.
Figure 3A:
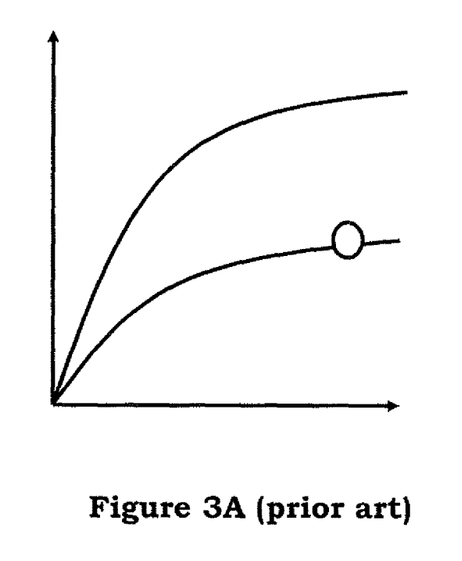
FIGS. 3a and 3b show an I-V curve according to the prior art.
Figure 3B:
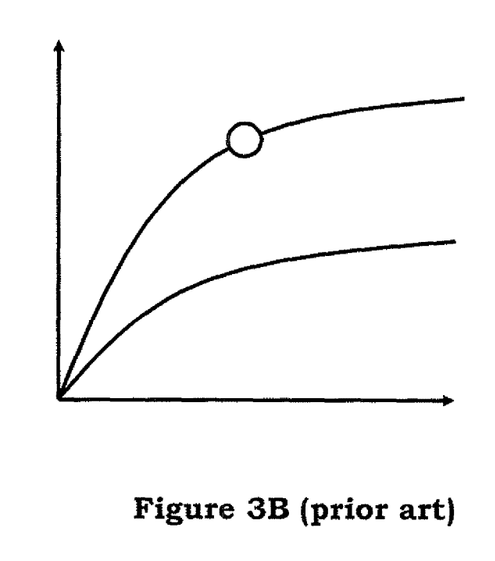

FIG. 2 shows a circuit for in-rush current mitigation according to another prior art. The methodology to mitigate in-rush current is to utilize so-called "Mother/Daughter" switch cell, which has two switches of different size inside (one small switch is named "Daughter" and another bigger one is named "Mother"). When all switch cells are turn-on, the Daughter's input 211 in switch cell 21 receives SleepEn signal and the Daughter's output 212 transmits it to the next switch cell 22 having a corresponding Daughter's input 221 and Daughter's output 222 which is then transmitted to switch cell 23 having a corresponding Daughter's input 231 and Daughter's output 232 and so on. As going on the last switch cell's 29 Daughter's input 291 receives SleepEn signal and the Daughter's output 292 transmits it back to the Mother's input 293 in same switch cell 29. From the Mother's output 294 the SleepEn signal is transferred to the Mother's input 213 in switch cell 21 via switch cells 28-22 and corresponding Mother's inputs 283, 273, 264, 254, 244, 233, and 223 and Mother's outputs 284, 274, 263, 253, 243, 234, and 224 and goes out an ACK signal from the Mother's output 214. FIG. 3A indicates the I-V curve at Daughter's input 291 when switching on Daughter switches only. FIG. 3B indicates the I-V curve at the Mother's input 293 as switching on Mother switches only.

In order to fit nowadays' specification, switch cells should be used in design. However, there is large in-rush current while maintaining ramp-up time. "In-rush current" could compromise the power network integrity. It needs to reduce in-rush current to acceptable one, such that this design could meet specifications.

SUMMARY OF THE INVENTION

The purpose of this invention is to provide a power gating apparatus for in-rush current mitigation, which adopts a delay unit to delay a switch signal, such that the dwell time of the current is controlled for reducing the peak value of the current.

Another purpose of this invention is to provide a power gating apparatus for in-rush current mitigation, which controls a front-end switch circuit assembly and a back-end switch circuit assembly to be opened and closed for reducing the rise time of current.

Another purpose of this invention is to provide a power gating apparatus for in-rush current mitigation. The controller controls effectively the switch circuit element be opened and closed for stabilizing current. If one of the switch circuit element is broken down, other switch circuit element still keep working. Thus, this invention provides high reliability.

To achieved the above-mentioned objective, one embodiment of the present invention provides a power gating apparatus for in-rush current mitigation, including a controller receiving an input power and a switch signal, at least one front-end switch circuit assembly receiving an input current and the switch signal, wherein the input current of the input power passes through the front-end switch circuit assembly, and the switch signal is outputted; wherein a current is inputted into at least one of the front-end switch circuit assembly by the controller according to a target value of an in-rush current of the input power for in-rush current mitigation; a delay unit electrically connected to the front-end switch circuit assembly and receiving the switch signal, wherein the delay unit delays the switch signal to reduce the peak value of the current and outputs the switch signal; and at least a back-end switch circuit assembly electrically connected to the delay unit and receiving the switch signal, wherein the back-end switch circuit assembly maintains a linear relationship between the current and a voltage for outputting the stable current. The invention adopts the delay unit delays the switch signal to control the dwell time of the current and reduce the peak value of the current. However, the quantity of electricity is not be changed.

To achieved the above-mentioned objective, one embodiment of the present invention provides a power gating apparatus for in-rush current mitigation, including: a controller receiving an input power and a switch signal; a plurality of switch circuit assemblies, wherein each switch circuit assembly receives an input current and the switch signal, wherein the input current of the input power passes through the switch circuit assembly and the switch signal is outputted; wherein a current is inputted into at least one of the switch circuit assembly by the controller according to a target value of an in-rush current of the input power for in-rush current mitigation; and a delay unit electrically connected to the switch circuit assembly and receiving the switch signal, wherein the delay unit delays the switch signal to reduce the peak value of the current and outputs the switch signal.

Other advantages of the present invention will become apparent from the following description taken in conjunction with the accompanying drawings, which are set forth by way of illustration and example, to certainly embody the present invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The detailed explanation of the present invention is described as following. The described preferred embodiments are presented for purposes of illustrations and description, and they are not intended to limit the scope of the present invention.

The invention discloses a circuit for in-rush current mitigation and reliability enhancement, which minimizes in-rush current while prevent the damage of circuit.

Figure 4:
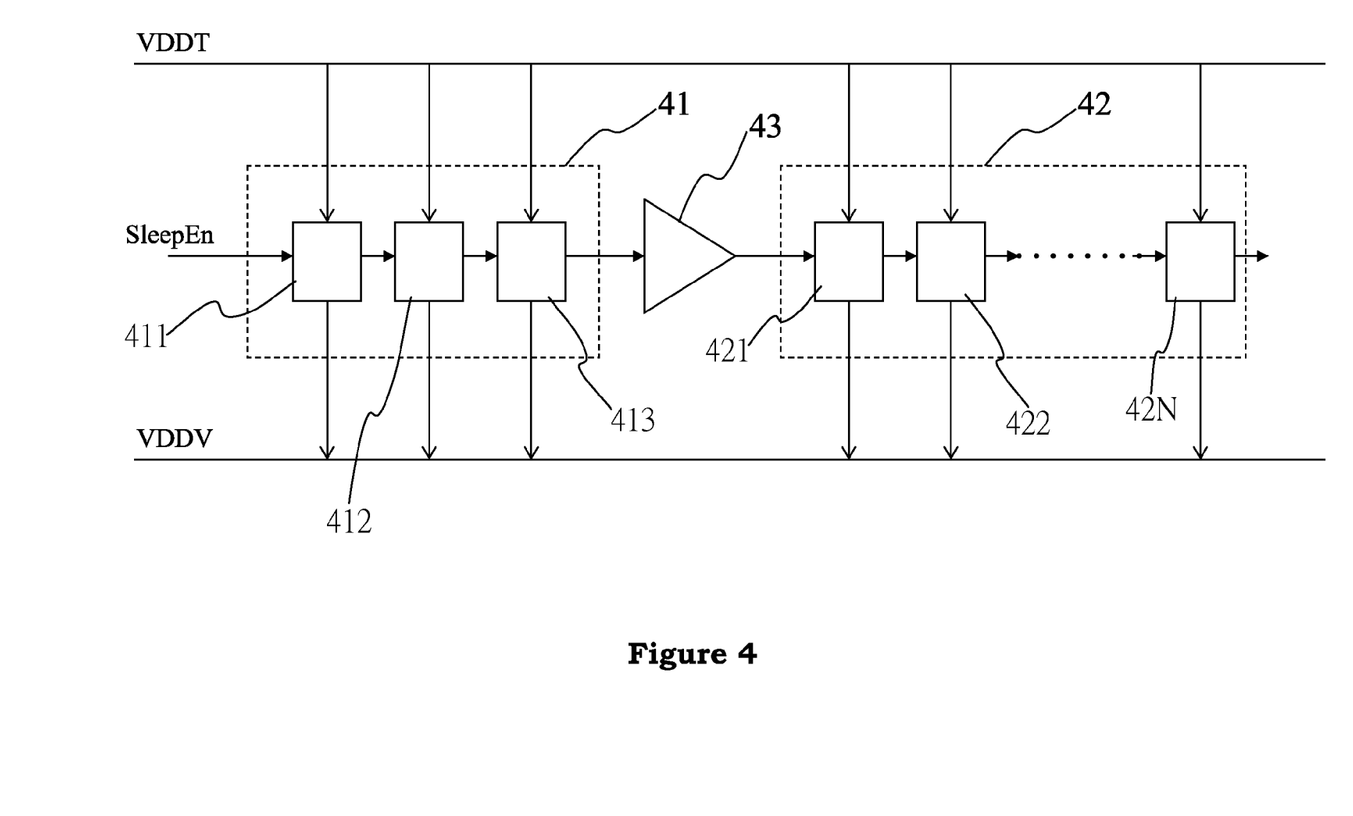
FIG. 4 is a schematic diagram illustrating a power gating apparatus for in-rush current mitigation according to one embodiment of the present invention.

FIG. 4 is a schematic diagram illustrating a power gating apparatus for in-rush current mitigation according to one embodiment of the present invention. The front-end switch circuit assembly 41 receives an input power (VDDT) and a switch signal (SleepEn). When the input power inputs the front-end switch circuit assembly 41, the current of input power goes to the virtual voltage (VDDV) through the front-end switch circuit assembly 41. Because the front-end switch circuit assembly 41 includes a plurality of switch circuit elements 411, 412, and 413 serially connected, the voltage can be raised to reduce the voltage difference between the input power (VDDT) and the virtual voltage (VDDV).

The delay unit 43 is electrically coupled to the front-end switch circuit assembly 41 and receives the switch signal (SleepEn). The delay unit 43 delays the switch signal to reduce the peak value of the current.

The back-end switch circuit assembly 42 is electrically coupled to the delay unit 43 and receives the switch signal (SleepEn). The back-end switch circuit assembly 42 maintains a linear relationship between the current and a voltage for outputting the stable current.

Accordingly, in one embodiment the front-end switch circuit assembly 41 includes N switch circuit elements 411, 412, and 413 serially connected. The switch circuit elements 411, 412, and 413 are semiconductor devices, and have the characteristics of semiconductor. In addition, the front-end switch circuit assembly 41 has higher resistance with higher input power, and lower resistance with lower input power.

The delay unit 43 is a programmable delay unit for controlling dwell time of the current. The back-end switch circuit assembly 42 includes N switch circuit elements 411, 412, and 413 serially connected. The switch circuit elements are semiconductor devices, and have the characteristics of semiconductor. The delay unit 43 controls the time for the switch signal (SleepEn) entering into the semiconductor switch cell and lets the back-end switch circuit assembly 42 run in linear region. When the back-end switch circuit assembly 42 is turned on, the I-V relation of the back-end switch circuit assembly 42 will be located at linear operation region due to low voltage difference between the input power (VDDT) and the virtual voltage (VDDV).

Accordingly, the smaller semiconductor switch cell in the back-end switch circuit assembly 42 shunts the current to prevent the damage of circuit by large current and mitigate the impact of the integrated circuit by in-rush current. The delay unit 43 also controls the time for current passing through the front-end switch circuit assembly 41 and the time for opening the back-end switch circuit assembly 42.

In one embodiment, the front-end switch circuit assembly 41, the delay unit 43 and the back-end switch circuit assembly 42 are metal oxide semiconductor field effect transistors integrated in one chip, or embedded in a system-on-chip.

Figure 7:
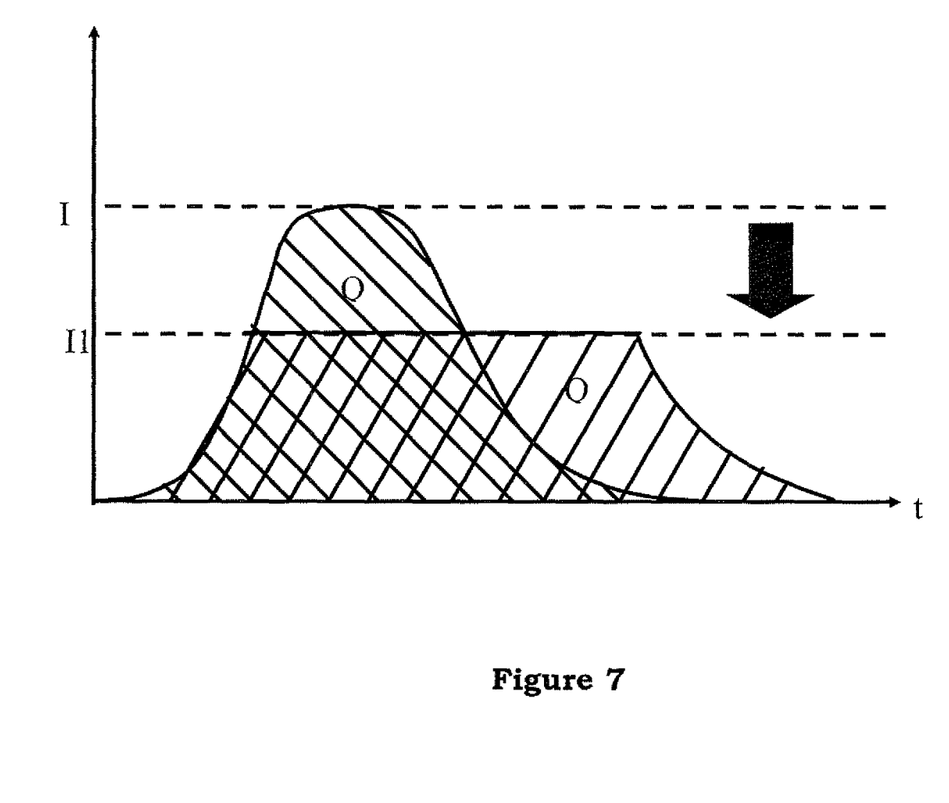
FIG. 7 shows an I-T curve according to one embodiment of the present invention.

In addition, FIG. 7 shows an I-T curve according to one embodiment of the present invention. At the same Q value, the delayed current I1' will be lower than the original current I (difference in X). Therefore the in-rush current can be mitigated.

Figure 5:
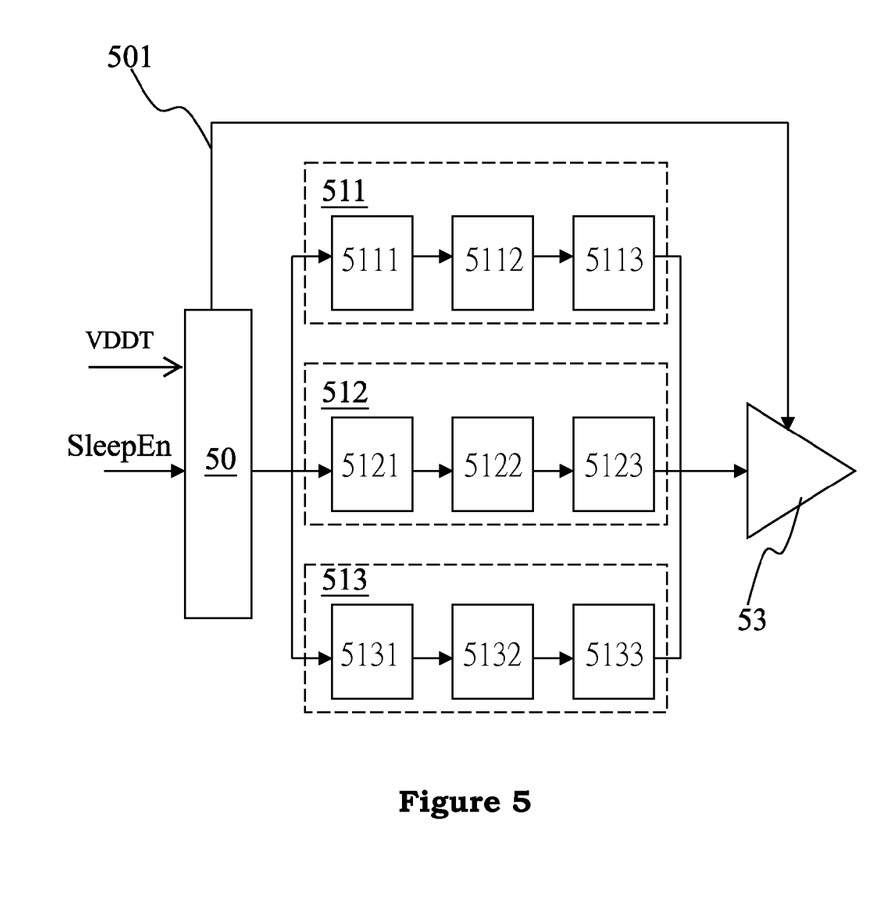
FIG. 5 is a schematic diagram illustrating a power gating apparatus for in-rush current mitigation according to one embodiment of the present invention.

FIG. 5 is a schematic diagram illustrating a power gating apparatus for in-rush current mitigation according to one embodiment of the present invention. A first stage of circuit includes a controller 50 and switch circuit assemblies 511, 512, 513. The switch circuit assemblies 511, 512, 513 are composed by several switch circuit elements 5111, 5112, and 5113, 5121, 5122, and 5123, and 5131, 5132, and 5133 in serial connection electrically. The controller 50 adapts the power supplied to each of the switch circuit assembly in response to the input power according to a target value of an in-rush current of the input power, in order to mitigate in-rush current entering into the switch circuit assembly. Each of switch circuit assembly 511, 512, 513 receives an input current and the switch signal (SleepEn), so that the current of input power can pass through.

Each of switch circuit assembly 511, 512, 513 has a plurality of switch circuit elements made of PMOS transistors and connected serially electrically. Although 3 switch circuit assemblies are used in this embodiment, in the real life situation they may have more than 3 switch circuit assemblies to solve problem, such that more switch circuit elements in one cell group could happen reasonably. The controller 50 may have more selections with more switch circuit assemblies randomly, which may give higher stability to the present invention.

The controller 50 controls the on/off of switch circuit assembly 511, 512, 513 by receiving the switch signal (SleepEn). When the target current is large, more switch circuit assemblies are turned on to reduce the current entering into the switch circuit assemblies. On the contrary, when the current is low, less switch circuit assemblies are turned on for keeping the stable current. In addition, when 3 switch circuit assemblies 511, 512, 513 are turned on simultaneously, the current can be raised to a prescribed value quickly, in order to reduce the ramp-up time. In another embodiment, when the switch circuit assembly cannot work properly, the controller 50 will not select the subject switch circuit assembly, in order to keep stable current.

The delay unit 53 is coupled to the switch circuit assemblies 511, 512, 513 and input the switch signal (SleepEn). The delay unit 53 is a programmable delay unit for controlling dwell time of the current. The delay unit 53 delays the switch signal to reduce the peak value of the current by receiving signal 501 transmitted by the controller 50.

Figure 6:
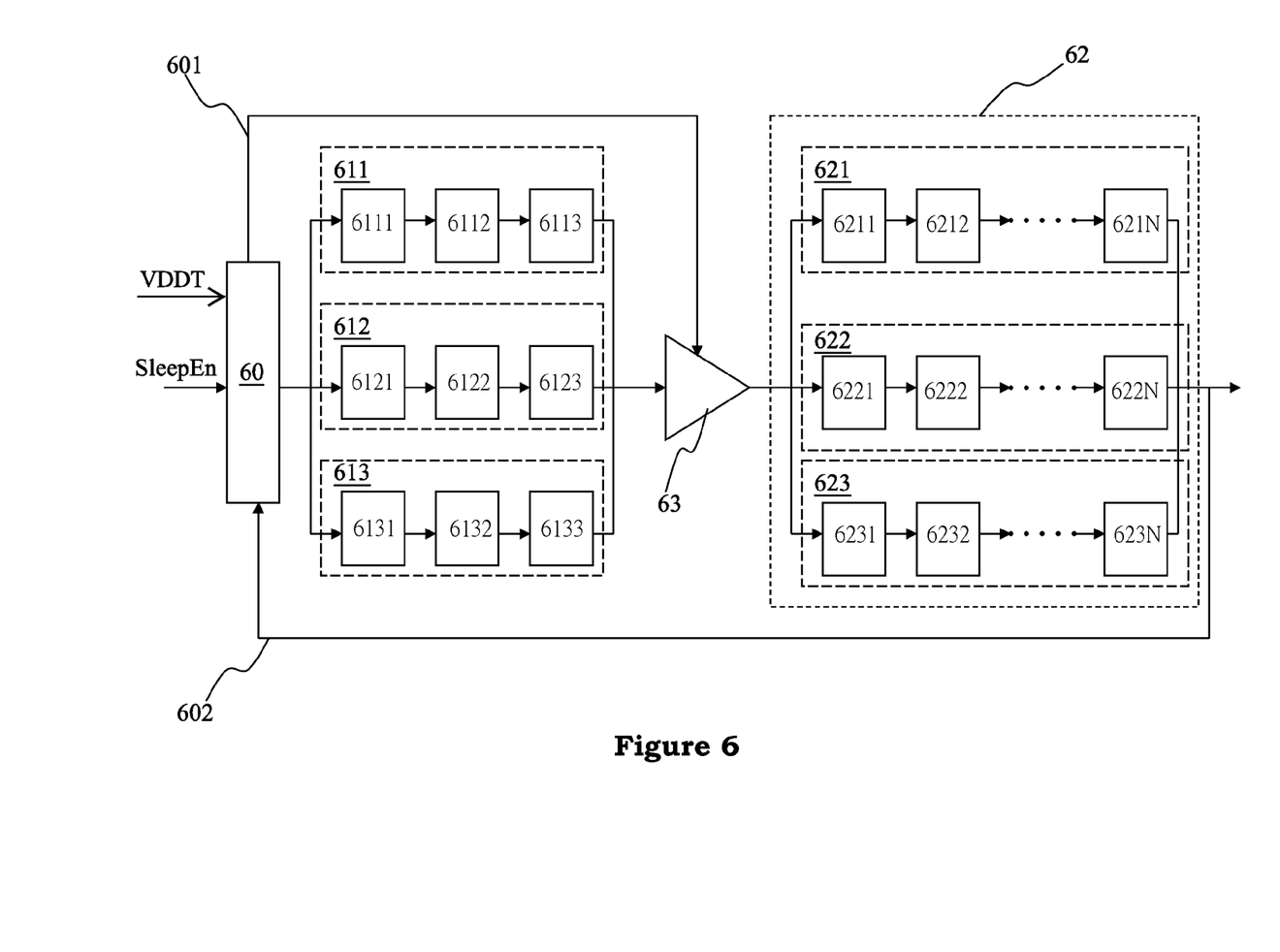
FIG. 6 is a schematic diagram illustrating a power gating apparatus for in-rush current mitigation according to another embodiment of the present invention.

Please referring FIG. 6 is a schematic diagram illustrating a power gating apparatus for in-rush current mitigation according to one embodiment of the present invention. The front-end switch cell includes a controller 60 and front-end switch circuit assemblies 611, 612, 613. The switch circuit assemblies 611, 612, 613 are composed by several switch circuit elements 6111, 6112, and 6113, 6121, 6122, and 6123, and 6131, and 6132, and 6133 in serial connection electrically. The controller 60 adapts the power supplied to each of the switch circuit assembly in response to the input power according to a target value of an in-rush current of the input power, in order to mitigate in-rush current entering into the switch circuit assembly. Each of switch circuit assembly 611, 612, 613 receives an input current, so that the current of input power can pass through.

Each of switch circuit assembly 611, 612, 613 has a plurality of switch circuit elements made of PMOS transistors in serial connection electrically. Although 3 sets of switch circuit assemblies 611, 612, 613 are used in this embodiment, in the real life situation they may have more switch circuit assemblies or every set has more switch circuit elements.

The controller 60 can control the on/off of switch circuit assembly. When the target current is large, more switch circuit assemblies are turned on to reduce the current entering into the switch circuit assemblies. On the contrary, when the current is low, less switch circuit assemblies are turned on for keeping the stable current.

The delay unit 63 is coupled to the switch circuit assemblies 611, 612, 613 and input the current. The delay unit 63 is a programmable delay unit for controlling dwell time of the current to reduce the peak value of the current. The delay unit 63 receives the signal 601 transmitted by the control unit 60 to control the time interval of current passing through.

The back-end switch circuit assembly 62 has several switch circuit assemblies 621, 622, 623 electrically connected to the delay unit 63 for inputting the current. The back-end switch circuit assembly 62 maintains a linear relationship between the current and a voltage for reducing the ramp-up time and outputting the stable current. The back-end switch circuit assembly 62 outputs an ACK signal (confirmed signal) 602 back to the control unit 60.

Each of back-end switch circuit assembly 621, 622, 623 has a plurality of switch circuit elements made of PMOS transistors in serial connection electrically, and the back-end switch circuit assemblies 621, 622, 623 are electrically connected in parallel. Although 3 sets of switch circuit assemblies 621, 622, 623 are used in this embodiment, in the real life situation they may have more switch circuit assemblies or every set has more switch circuit elements.

Accordingly, in one embodiment the each of back-end switch circuit assembly 621, 622, 623 includes N switch circuit elements 6211 to 621N, 6221 to 622N, 6231 to 623N serially connected. The switch circuit elements are semiconductor devices, and have the characteristics of semiconductor.

The delay unit 63 is a programmable delay unit for controlling dwell time of the current, in order to control the time interval of current passing through.

Accordingly, the front-end switch circuit assembly 611, 612, 613 and the back-end switch circuit assembly 621, 622, 623 would turn-on simultaneously to receive the switch signal (SleepEn) for reducing the ramp-up time of the present invention.

Figure 8:
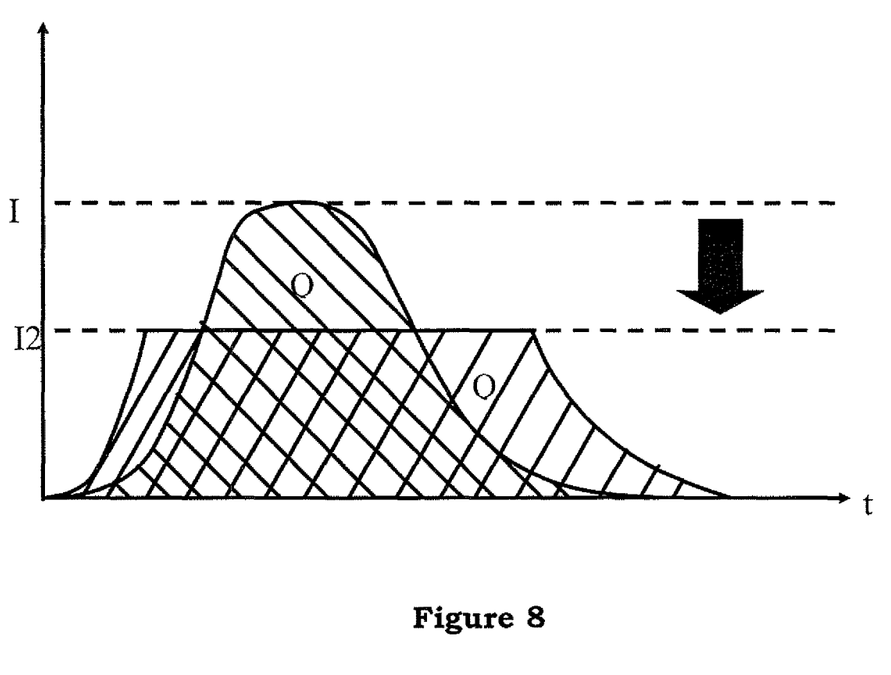
FIG. 8 shows an I-T curve according to another embodiment of the present invention.

Please referring FIG. 8 shows an I-T curve according to one embodiment of the present invention. At the same Q value, the delayed current I2' will be lower than the original current I (difference in X). Therefore the in-rush current can be mitigated by the present invention. Because 3 sets of front-end switch circuit assemblies 611, 612, 613 are used in this embodiment, the current can reach the prescribed value quickly.

The front-end switch circuit assembly is run in saturation region in the present invention. The delay cell is used to delay the switch signal to control the passing time of current, in order to reduce the peak value of current. Finally, the back-end switch circuit assembly maintains a linear relationship between the current and a voltage for reducing the ramp-up time. They may be integrated in an integrated circuit and finished in a same process.

In addition, the control unit controls effectively the switch circuit element been opened and closed for stabilizing current. The quantity of switch circuit assembly should be able to be increased or decreased in accordance with the design of switch circuit element. Thus the best current buffer circuit can be made in accordance with the present invention. If one of the switch circuit assemblies is broken down, other switch circuit assemblies still keep working. Thus, this invention provides high reliability.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A power gating apparatus configured to mitigate in-rush current comprising:
   a controller configured to receive an input power and a switch signal;
   at least one front-end switch circuit assembly configured to receive an input current and the switch signal, wherein the input current is current of the input power to pass through the front-end switch circuit assembly and the switch signal is outputted;
   wherein the controller is configured to mitigate in-rush current by inputting the current into the at least one front-end switch circuit assembly in accordance to a target value of an in-rush current of the input power;
   a delay unit electrically connected to the front-end switch circuit assembly and configured to receive the switch signal, wherein the delay unit is configured to delay the switch signal to reduce the peak value of the current and outputs the switch signal; and
   at least one back-end switch circuit assembly electrically connected to the delay unit and configured to receive the switch signal, wherein the back-end switch circuit assembly maintains a linear relationship between the current and a voltage for outputting stable current.

2. The apparatus according to claim 1, wherein the front-end switch circuit assembly comprises a plurality of switch circuit elements serially connected, the back-end switch circuit assembly comprises a plurality of switch circuit elements serially connected, and the switch circuit element comprises semiconductor switch elements.

3. The apparatus according to claim 1, further comprising a plurality of front-end switch circuit assemblies, each of said front-end switch circuit assemblies being arranged in parallel connection.

4. The apparatus according to claim 1, wherein the delay unit comprises a programmable delay unit to delay the switch signal and control dwell time of the current, and the programmable delay unit comprises a semiconductor element.

5. The apparatus according to claim 1, further comprising a plurality of back-end switch circuit assemblies, each of said back-end switch circuit assemblies being arranged in parallel connection.

6. The apparatus according to claim 1, wherein the front-end switch circuit assembly, the back-end switch circuit assembly and the delay unit are integrated in one chip, or embedded in a system-on-chip.

7. A power gating apparatus configure to mitigate in-rush current, comprising:
  a controller configured to receive an input power and a switch signal;
  a plurality of switch circuit assemblies, wherein each switch circuit assembly is configured to receive an input current and the switch signal, wherein the input current is current of the input power to pass through the switch circuit assembly and the switch signal is outputted;
  wherein the controller is configured to mitigate in-rush current by inputting the current into the at least one of the plurality of switch circuit assemblies in accordance to a target value of an in-rush current of the input power; and
  a delay unit electrically connected to the switch circuit assembly and configured to receive the switch signal, wherein the delay unit is configured to delay the switch signal to reduce the peak value of the current and outputs the switch signal.

8. The apparatus according to claim 7, wherein the switch circuit assembly comprises a plurality of switch circuit element serially connected, and the switch circuit elements comprise semiconductor switch elements.

9. The apparatus according to claim 7, further comprising a plurality of switch circuit assemblies, each of the switch circuit assemblies being arranged in parallel connection.

10. The apparatus according to claim 7, wherein the delay unit comprises a programmable delay unit to delay the switch signal and control dwell time of the current, and the programmable delay unit comprises a semiconductor element.

\* \* \* \* \*